United States Patent [19]

Kaneda et al.

[11] Patent Number: 5,087,963
[45] Date of Patent: Feb. 11, 1992

[54] GLASS-SEALED SEMICONDUCTOR DEVICE

[75] Inventors: Kenichi Kaneda; Akio Tanda, both of Tokyo, Japan

[73] Assignee: NEC Corporation, Japan

[21] Appl. No.: 596,477

[22] Filed: Oct. 12, 1990

[30] Foreign Application Priority Data

Oct. 16, 1989 [JP] Japan .................................. 1-269645

[51] Int. Cl.⁵ ............................................ H01L 23/29
[52] U.S. Cl. ........................................ 357/73; 357/70; 357/74
[58] Field of Search ............................ 357/70, 74, 73

[56] References Cited

U.S. PATENT DOCUMENTS 3,697,666 10/1972 Wakley et al. .................... 357/74
4,590,672 5/1986 Shimizu et al. .................... 357/70

Primary Examiner—Eugene R. LaRoche
Assistant Examiner—R. A. Ratliff
Attorney, Agent, or Firm—Laff, Whitesel, Conte & Saret

[57] ABSTRACT

In a glass-sealed semiconductor device, low-melting glass is glazed on a ceramic base to fix a lead frame. A distal end portion of the lead frame, the distal end portion being connected to a semiconductor element, is fixed to the ceramic base through devitrifying glass layer.

5 Claims, 5 Drawing Sheets

GLASS-SEALED SEMICONDUCTOR DEVICE

BACKGROUND OF THE INVENTION

The present invention relates to a glass-sealed semiconductor device.

A conventional glass-sealed semiconductor device has the following structure, as shown in FIGS. 4A and 4B. Low-melting glass 3 is glazed in the entire region which surrounds a central recess 1 in a ceramic base 2, and a lead frame 4 for extracting external electrodes is fixed on the low-melting glass 3. Frame electrodes 5 for wire bonding having an aluminum layer thereon are formed at distal ends of the lead frame 4. A semiconductor element 6 is fixed to the recess 1 by a metal grazing material or the like, and electrode pads of the semiconductor element 6 and the frame electrodes 5 are electrically connected through metal wires 7. The low-melting glass 3 has a small three-dimensional surface pattern, thus constituting a glossy structure.

Wire bonding of the conventional glass-sealed semiconductor device is performed as follows. At the time of wire bonding, the lead frame 4 has an outer frame 12, as shown in FIG. 5. Holes 13 are formed at predetermined positions of the outer frame 12.

In order to wire-bond a semiconductor element 6, pad coordinates $(X_p, Y_p)$ of the semiconductor element 6 and coordinates $(X_l, Y_l)$ of the frame electrodes 5 at a reference position are stored in a bonder. On the pad side, the position of the semiconductor element 6 is automatically detected by pattern recognition prior to bonding, and differences $(\Delta X_p, \Delta Y_p,$ and $\Delta\theta_p)$ (where $\Delta\theta_p$ represents an angular difference) between the detected positions and the reference position are calculated. The reference coordinates $(X_p, Y_p)$ are corrected and calculated, thereby starting bonding.

On the side of the frame electrodes 5, positioning pins are respectively fitted in the holes 13 formed at the predetermined positions of the outer frame 12 on a bonding stage. The actual position of each frame electrode 5 is caused to coincide with the reference coordinates, and bonding is performed without correcting the reference coordinates $(X_l, Y_l)$. Errors tend to occur in bonding on the side of the frame electrodes 5. Bonding precision on the side of the frame electrodes 5 is poorer than that on the pad side because a positional relationship between the frame electrodes 5 and the holes 13 is lost due to patterning errors of the lead frame 4 and a mounting error of the lead frame 4 on the ceramic base 2. In addition, misalignment between the diameter of the positioning pin and the diameter of the corresponding hole 13 also causes the above error.

In order to improve bonding precision on the side of the frame electrodes 5, the actual position of the frame electrode 5 is automatically detected by pattern recognition on the side of the frame electrodes 5. However, since the low-melting glass 3 has a glossy surface due to a small three-dimensional surface pattern and reflects light, light reflected by the glass surface is mixed in a video signal from the frame electrode 5. The actual position of this frame electrode 5 cannot be pattern-recognized. For example, if the above light reflection does not occur, a binary image is obtained wherein a glass portion is given as black (i.e., a hatched portion) and a frame electrode is given as white in FIG. 3A. When light is reflected by the glass surface, it is given as white, as shown in FIG. 3B. The shape of the frame electrode 5 becomes unclear, and pattern recognition cannot be performed.

As described above, when the frame electrodes in the conventional glass-sealed semiconductor device are to be bonded, bonding errors occur, and reliability of connections between metal wires and the frame electrodes is degraded.

SUMMARY OF THE INVENTION

It is an object of the present invention to provide a glass-sealed semiconductor device having high reliability in connections between metal wires and frame electrodes.

In order to achieve the above object of the present invention, there is provided a glass-sealed semiconductor device in which low-melting glass is glazed on a ceramic base to fix a lead frame, and a distal end portion of the lead frame, the distal end portion being connected to a semiconductor element, is fixed to the ceramic base through devitrifying glass layer.

DESCRIPTION OF THE PREFERRED EMBODIMENTS

Preferred embodiments of the present invention will be described with reference to the accompanying drawings.

Figure 1A:
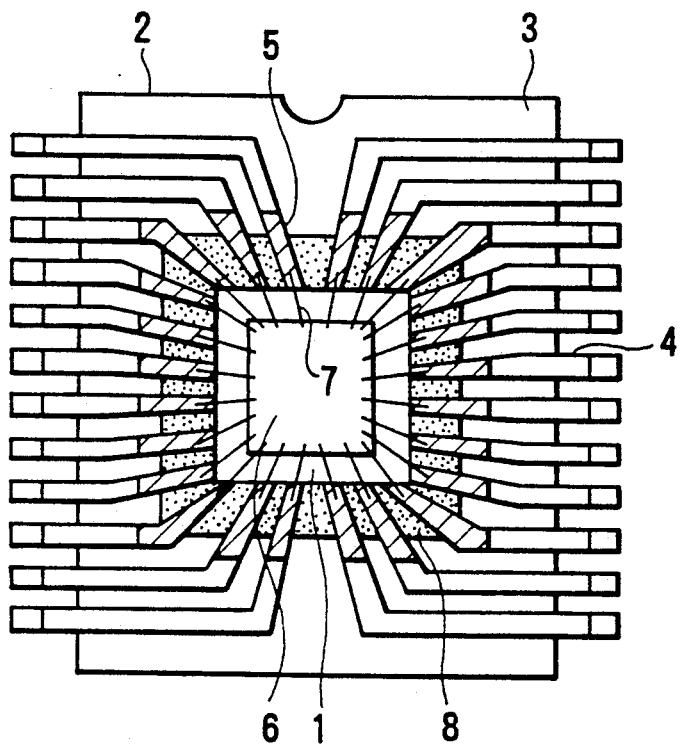
FIGS. 1A and 1B are a plan view and a sectional view, respectively, of the first embodiment of the present invention.
Figure 1B:
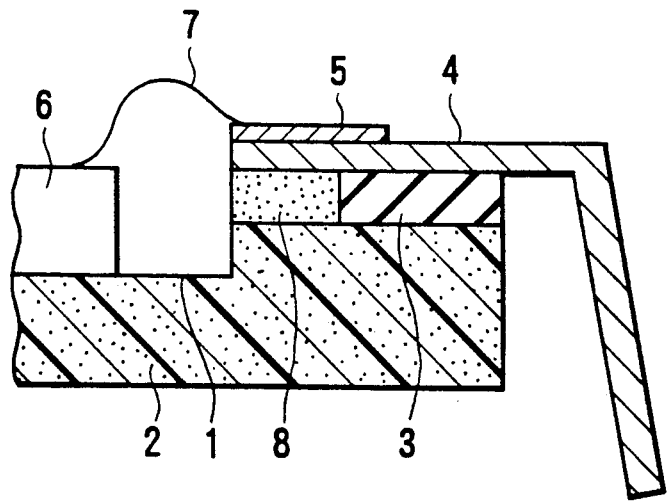
Figure 3A:
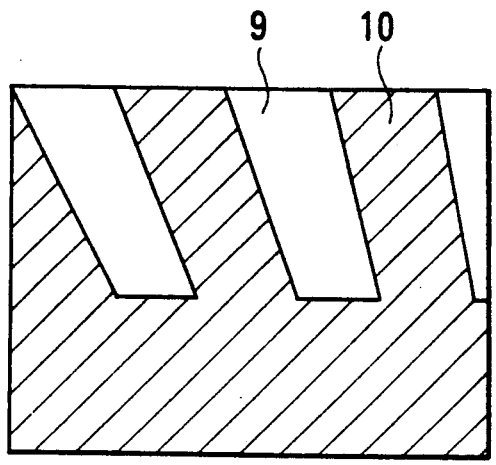
FIGS. 3A and 3B are respectively plan views for explaining binary images when a frame electrode is pattern-recognized.
Figure 3B:
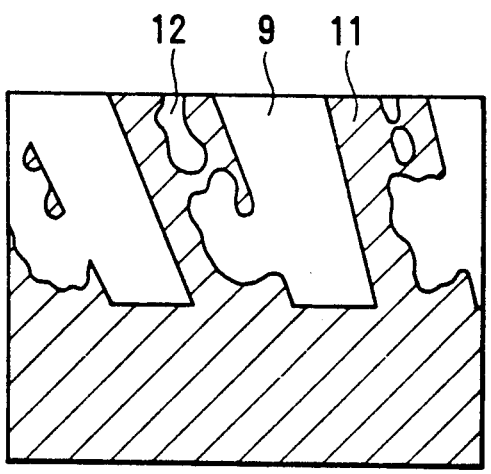

FIGS. 1A and 1B show the first embodiment of the present invention, and FIGS. 3A and 3B show binary images when a frame electrode is pattern-recognized.

Figure 4A:
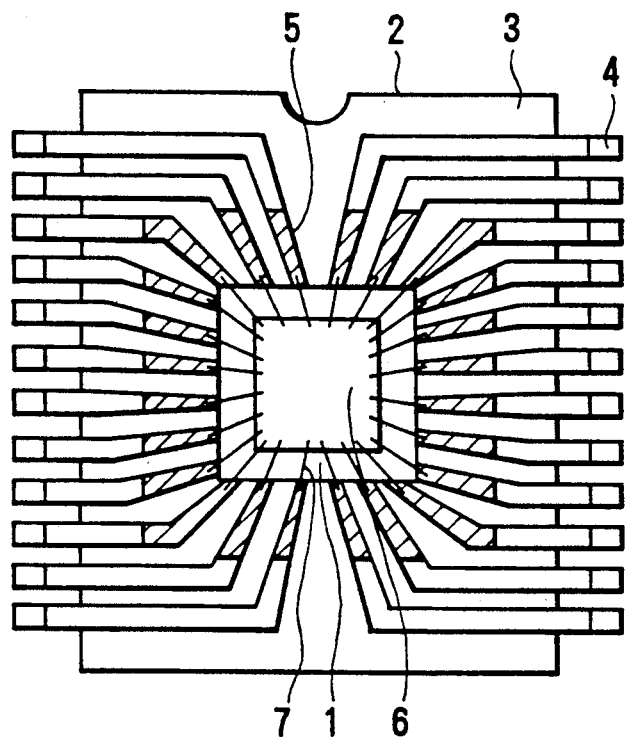
FIGS. 4A and 4B are a plan view and a sectional view, respectively, showing a conventional glass-sealed semiconductor device.
Figure 4B:
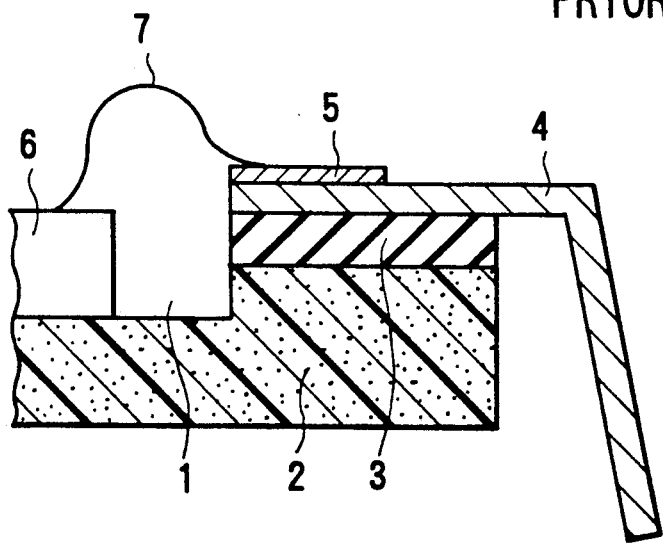
Figure 5:
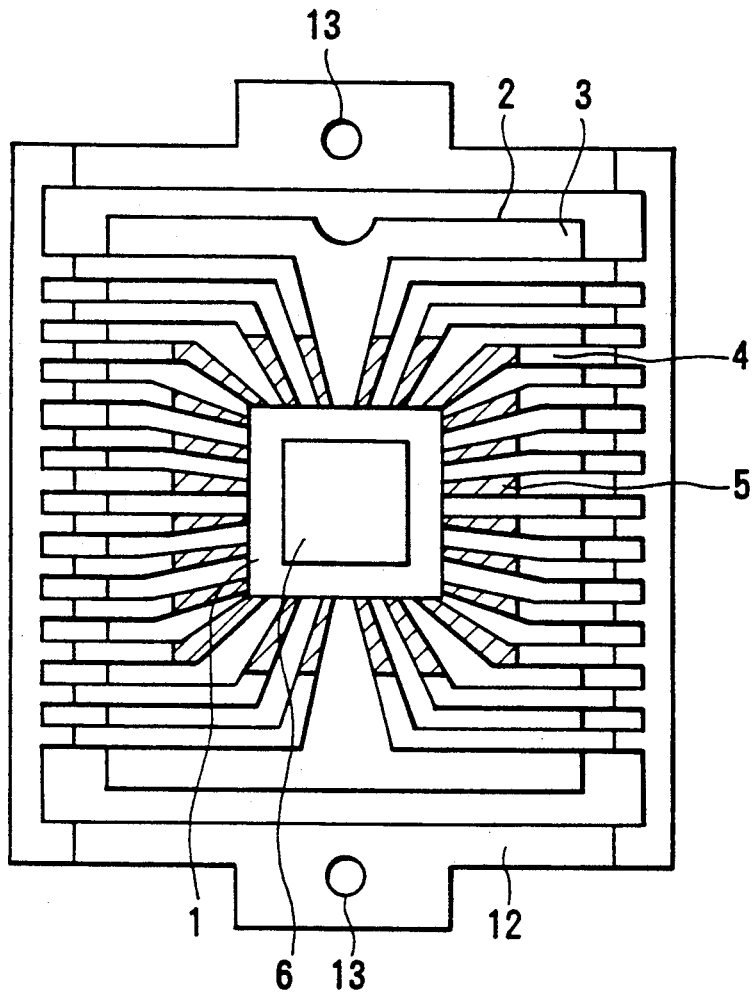
FIG. 5 is a plan view for explaining a wire-bonding method of a conventional glass-sealed semiconductor device.

The first embodiment has the same structure as in the conventional glass-sealed semiconductor device shown in FIG. 4, except that distal end portions of frame electrodes 5 are bonded to a ceramic base 2 through devitrifying glass 8.

The devitrifying glass 8 is defined as glass containing $PbO$-$B_2O_3$ as mother glass added with $ZrO_2$, $SiO_2$, or a fine powder of glass crystal serving as a crystal nucleus, thereby facilitating crystallization of glass. Once the devitrifying glass is crystallized by a heat treatment, it is not melted again at a sealing temperature (400° to 500° C.).

Although low-melting glass is $PbO$-$B_2O_3$ glass, it is melted again at the sealing temperature since a material serving as a crystal nucleus is not contained.

A glass-sealed semiconductor device can be easily formed as follows. Devitrifying glass 8 is glazed in a peripheral portion of a recess 1 of a ceramic base 2, low-melting glass 3 is glazed in a region outside the peripheral portion, and a lead frame is compression-bonded thereto. The low-melting glass 3 is normally amorphous. Since crystal grains are not precipitated in amorphous glass after sintering, its surface is a smooth mirror surface. Light incident on the glass surface is reflected strongly in one direction. As shown in FIG. 3B, this directional reflection interferes with lead frame recognition.

Since a large amount of crystal grains are precipitated in devitrifying glass after sintering, its surface has a fine three-dimensional surface pattern by these crystal grains. Light incident on the glass surface is scattered by the fine three-dimensional surface pattern and is weakened, and this light does not cause any trouble in pattern recognition, as shown in FIG. 3A.

Reference numeral 9 in FIG. 3A denotes a binary image of the frame electrodes; and 10, a binary image of the devitrifying glass. Reference numeral 11 in FIG. 3B denotes a binary image of the low-melting glass; 12, a binary image of light reflected by the low-melting glass.

In this embodiment, since each frame electrode 5 can be pattern-recognized, and reference coordinates $(X_i, Y_i)$ are corrected for bonding, positional precision on the frame electrode side can be as high as on the pad side.

The structure of this embodiment can be obtained by the following steps. Devitrifying glass is screen-printed in a peripheral portion of a recess of a ceramic base, and low-melting glass is screen-printed outside the peripheral portion. In this case, (a) a paste of a devitrifying glass powder is prepared, and the paste is printed and dried to obtain a film having a thickness of 0.1 to 0.15 mm; (b) a paste of a low-melting glass powder is prepared, and the paste is printed and dried to obtain a film having a thickness of 0.1 to 0.15 mm; and (c) the steps (a) and (b) are repeated three to five times to obtain a glass film having a predetermined thickness. The glass film is sintered at 350° to 400° C. for about five minutes. A lead frame is placed on the ceramic base printed with the glass film, and the lead frame and the ceramic base are heated and bonded to each other at 450° to 500° C. for 3 to 5 minutes, thereby obtaining a package. During heating for bonding the lead frame, the devitrifying glass is crystallized.

Figure 2A:
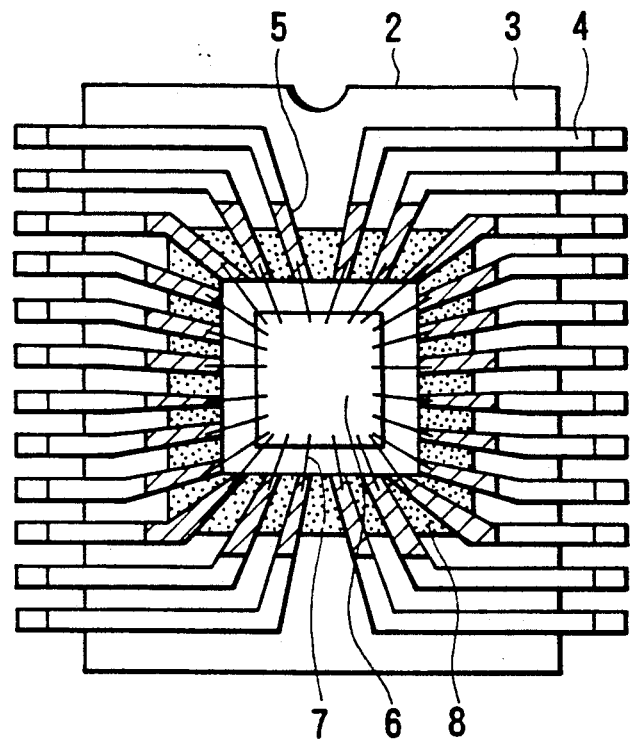
FIGS. 2A and 2B are a plan view and a sectional view, respectively, of the second embodiment of the present invention.
Figure 2B:
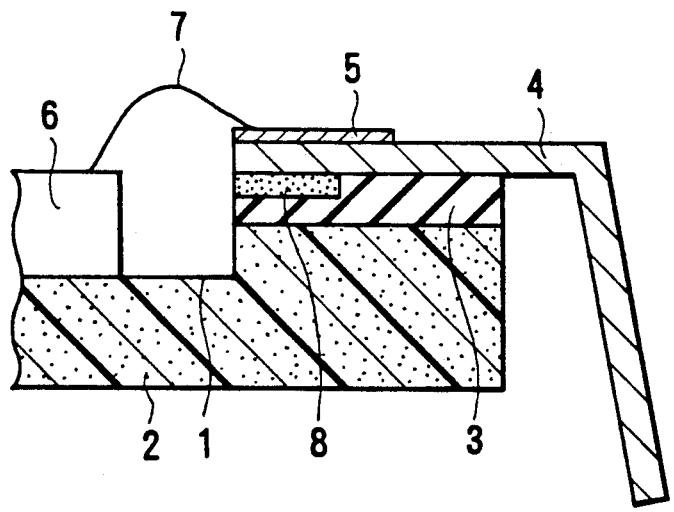

FIGS. 2A and 2B are a plan view and a sectional view, respectively, showing the second embodiment of the present invention.

The structure of the second embodiment shown in FIGS. 2A and 2B is substantially the same as that of the glass-sealed semiconductor device of the first embodiment shown in Figs. 1A and 1B, except that a glass layer of a distal end portion of each frame electrode 5 has a two-layered structure. In this case, the upper layer consists of devitrifying glass 8, and the lower layer consists of low-melting glass 3.

In this embodiment, the upper layer consisting of the devitrifying glass 8 reduces light reflection, and pattern recognition of the frame electrode 5 can be performed. Bonding precision on the frame electrode 5 can be as high as that on the pad.

In this embodiment, since the devitrifying glass 8 is not in direct contact with the ceramic base 2, unlike in the first embodiment, a stress caused by a difference between thermal expansion coefficients of the devitrifying glass 8 and the ceramic base 2 can be smaller than that of the first embodiment. Therefore, air-tightness of the semiconductor device can be improved as compared with the semiconductor device of the first embodiment.

According to the present invention, as has been described above, the distal end portion of each frame electrode is bonded with devitrifying glass, and light reflection from the glass surface can be weakened. As a result, the frame electrodes can be pattern-recognized, and the actual position of the frame electrode can be detected and then bonded. Bonding precision on the frame electrode side can be improved as high as that on the pad side. Reliability of connections between metal wires and frame electrodes can be improved.

As an application of the present invention, the present invention is very effective for a multi-pin type semiconductor device. When the number of pins is increased in a semiconductor device, the area of the frame electrodes for wire bonding is inevitably decreased. The frame electrodes must be pattern-recognized and must bonded with high precision. For this reason, a conventional multi-pin semiconductor device is an expensive stacked ceramic semiconductor device whose frame electrodes are printed with a metallized pattern. The present invention, however, can solve a conventional drawback of the glass-sealed semiconductor device, i.e., bonding errors on the frame electrode side. Therefore, an inexpensive multi-pin type glass-sealed semiconductor device can be provided, thereby greatly reducing the cost of the semiconductor device.

What is claimed is:

1. A glass-sealed semiconductor device in which low-melting glass is glazed on a ceramic base to fix a lead frame, and a distal end portion of said lead frame, said distal end portion being connected to a semiconductor element and being fixed to said ceramic base through devitrifying glass layer adjacent said low-melting glass.

2. A device according to claim 1, wherein there are further provided low-melting glass between said devitrifying glass and said ceramic base.

3. A device according to claim 2, wherein said devitrifying glass and said low-melting glass are glazed in a periphery portion of a recess of said ceramic base, and said low-melting glass is extended to a region outside the peripheral portion.

4. A device according to claim 1, wherein said devitrifying glass is glazed in a periphery portion of a recess of said ceramic base, and said low-melting glass is glazed in a region outside the peripheral portion.

5. A device according to claim 1, wherein there are further provided a frame electrode on the distal end portion which is connected to a part of semiconductor element via wiring.

* * * * *